(12) United States Patent
Inagaki et al.

(10) Patent No.: US 12,369,274 B2
(45) Date of Patent: Jul. 22, 2025

(54) VAPOR CHAMBER

(71) Applicant: Furukawa Electric Co., Ltd., Tokyo (JP)

(72) Inventors: Yoshikatsu Inagaki, Tokyo (JP); Kenya Kawabata, Tokyo (JP); Hirofumi Aoki, Tokyo (JP)

(73) Assignee: Furukawa Electric Co., Ltd., Tokyo (JP)

( * ) Notice: Subject to any disclaimer, the term of this patent is extended or adjusted under 35 U.S.C. 154(b) by 349 days.

(21) Appl. No.: 17/571,407

(22) Filed: Jan. 7, 2022

(65) Prior Publication Data

US 2022/0132697 A1 Apr. 28, 2022

Related U.S. Application Data

(63) Continuation of application No. PCT/JP2021/002195, filed on Jan. 22, 2021.

(30) Foreign Application Priority Data

Jan. 31, 2020 (JP) ................................. 2020-015655

(51) Int. Cl.
*H05K 7/20* (2006.01)
*H05K 9/00* (2006.01)

(52) U.S. Cl.
CPC ......... *H05K 7/2029* (2013.01); *H05K 9/0049* (2013.01)

(58) Field of Classification Search
CPC . H05K 7/2029; H05K 7/20336; H05K 9/0049
See application file for complete search history.

(56) References Cited

U.S. PATENT DOCUMENTS

| | | |
|---|---|---|
| 2001/0022219 A1 | 9/2001 | Ikeda et al. |
| 2002/0023742 A1 | 2/2002 | Dussinger et al. |
| 2005/0051307 A1 | 3/2005 | Dussinger et al. |
| 2006/0000579 A1 | 1/2006 | Whitney et al. |
| 2006/0032615 A1 | 2/2006 | Dussinger et al. |
| 2006/0181858 A1 | 8/2006 | Kamemoto |

(Continued)

FOREIGN PATENT DOCUMENTS

| | | |
|---|---|---|
| CN | 1822758 A | 8/2006 |
| CN | 204217285 U | 3/2015 |

(Continued)

OTHER PUBLICATIONS

WO2018003957A1 Translation (Year: 2018).*

(Continued)

*Primary Examiner* — Schyler S Sanks
(74) *Attorney, Agent, or Firm* — Dorsey & Whitney LLP (57) ABSTRACT

A vapor chamber is provided that allows space-saving and weight reduction of a device in which the vapor chamber is to be mounted. The vapor chamber has a container in which a cavity portion is formed by one plate-shaped body and another plate-shaped body facing the one plate-shaped body, and a working fluid enclosed in the cavity portion. The container includes a heat transfer portion that transfers heat by a phase change of the working fluid, and an extending portion that extends outwards from the heat transfer portion and has a function other than a heat transfer function.

17 Claims, 5 Drawing Sheets

(56) References Cited

U.S. PATENT DOCUMENTS

| | | |
|---|---|---|
| 2006/0243425 A1 | 11/2006 | Dussinger et al. |
| 2007/0294892 A1 | 12/2007 | Yang et al. |
| 2009/0308574 A1 | 12/2009 | Liu et al. |
| 2013/0002987 A1 | 1/2013 | Sugiura |
| 2014/0360701 A1 | 12/2014 | Aoki et al. |
| 2016/0135336 A1* | 5/2016 | Wu .................. H05K 7/2039 361/818 |
| 2017/0138673 A1* | 5/2017 | Aoki .................. F28D 15/04 |
| 2018/0313615 A1 | 11/2018 | Nakamura et al. |
| 2019/0021188 A1 | 1/2019 | Phan et al. |
| 2019/0024984 A1* | 1/2019 | Aoki .................. H05K 7/20336 |
| 2020/0045848 A1 | 2/2020 | Wakaoka et al. |
| 2021/0095930 A1 | 4/2021 | Inagaki et al. |

FOREIGN PATENT DOCUMENTS

| | | | | |
|---|---|---|---|---|
| CN | 107205330 | A | 9/2017 | |
| CN | 209605636 | U | 11/2019 | |
| CN | 209643211 | U | 11/2019 | |
| CN | 110530184 | A | 12/2019 | |
| JP | H04284694 | A | 10/1992 | |
| JP | H07193380 | A | 7/1995 | |
| JP | H10126075 | A | 5/1998 | |
| JP | H11237193 | A | 8/1999 | |
| JP | 2002544469 | A | 12/2002 | |
| JP | 2004037001 | A | 2/2004 | |
| JP | 2004095684 | A | 3/2004 | |
| JP | 2008505304 | A | 2/2008 | |
| JP | 2013174376 | A | 9/2013 | |
| JP | 2014109401 | A | 6/2014 | |
| JP | 2016035348 | A | 3/2016 | |
| JP | 2017110891 | A | 6/2017 | |
| JP | 2018162949 | A | 10/2018 | |
| JP | 2018185094 | A | 11/2018 | |
| JP | 2018189349 | A | 11/2018 | |
| JP | 2019116990 | A | 7/2019 | |
| JP | 2019207076 | A | 12/2019 | |
| TW | I291540 | B | 12/2007 | |
| TW | 294325 | B | 3/2008 | |
| TW | I395918 | B | 5/2013 | |
| WO | 9953254 | A1 | 10/1999 | |
| WO | 2011114598 | A1 | 9/2011 | |
| WO | 2017104819 | A1 | 6/2017 | |
| WO | 2017150356 | A1 | 9/2017 | |
| WO | WO-2018003957 | A1 * | 1/2018 | ......... F28D 15/0233 |
| WO | 2018199217 | A1 | 11/2018 | |

OTHER PUBLICATIONS

Notice of Reasons for Refusal mailed Nov. 8, 2023 for JP Application No. 2022-084822, pp. all.

[English Translation] Notice of Reasons for Refusal mailed on Dec. 14, 2021 for Japanese Patent Application No. 2020-15655.

International Search Report and Written Opinion (English Translation for ISR Only) mailed on Mar. 9, 2021 for PCT Application No. PCT/JP2021/002195.

International Search Report and Written Opinion (English Translation for ISR only) mailed on Mar. 9, 2021 for PCT Application No. PCT/JP2021/002196; pp. all.

Notice of Reasons for Refusal dated Mar. 28, 2022 in the Japanese application No. 2020-15655 with English translation; pp. all.

U.S. Appl. No. 17/571,432 titled "Vapor Chamber" filed Jan. 7, 2022, pp. all pages of the application as filed.

[English Translation] Notice of Opinion on Examination dated Apr. 22, 2022 for Taiwanese Patent Application No. 110102998; pp. all.

[English Translation] Notice of Opinion on Examination dated on Apr. 22, 2022 for Taiwanese Patent Application No. 110102995; pp. all.

[English Translation] Decision of Rejection mailed Nov. 3, 2022 in TW Application No. 110102998; pp. all.

Notice of Examination Opinion for Taiwanese Patent Application No. 110102995 dated May 22, 2023, pp. all.

Notice of Reasons for Refusal for Japanese Patent Application No. 2022-084822 mailed May 30, 2023, pp. all.

Notice of Reasons for Refusal for Japanese Patent Application No. 2022-084823 mailed on May 30, 2023, pp. all.

[English Translation] Decision of Rejection dated Dec. 2, 2022 in TW application No. 110102995; pp. all.

* cited by examiner

VAPOR CHAMBER

CROSS REFERENCE TO RELATED APPLICATIONS

The present application is a continuation application of International Patent Application No. PCT/JP2021/002195 filed on Jan. 22, 2021, which claims the benefit of Japanese Patent Application No. 2020-015655, filed on Jan. 31, 2020. The contents of these applications are incorporated herein by reference in their entirety.

BACKGROUND

Technical Field

The present disclosure relates to a vapor chamber having, in addition to a heat transfer function which is its original function, a function other than the heat transfer function.

Background

Amounts of heat generated by electronic components such as semiconductor elements mounted on electric/electronic devices have been increased with enhanced functionality, and cooling of the electronic components has become more important, for example, in view of preventing malfunctions of the electronic components. Additionally, heating elements such as electronic components may be disposed in narrow spaces, for example, due to miniaturization of electric/electronic devices or high-density mounting of electronic components. As a method of cooling a heating element such as an electronic component disposed in a narrow space, a vapor chamber, which is a plane-shaped heat transfer device, may be used.

In view of reduction of loads on the environment and the like, electric-powered transport devices such as electric vehicles (EVs), in which batteries are mounted instead of internal combustion engines, have been recently widespread. Since heating values of such batteries have been increased with enhanced functionality of the electric-powered transport devices, cooling of the batteries has become more important to maintain normal operation of the batteries. Additionally, since further extension of seat spaces has been required to improve ride quality of the electric vehicles, further reduction in installation spaces of the batteries has been needed. As a method of cooling a heating element such as a battery mounted in a limited space, a vapor chamber, which is a plane-shaped heat transfer device, may be used.

On account of the above, the vapor chamber is required to have excellent heat transfer properties. Accordingly, a vapor chamber has been proposed which includes a container, pillars disposed in an internal space of the container to support the container from inside of the container, a working fluid enclosed in the internal space of the container, and a wick structure disposed in the internal space of the container, for example (Japanese Patent Laid-Open No. 2018-189349). In this vapor chamber, at least a part of an inner surface of the container is exposed to the internal space of the container, and has pores having an average depth of 10 nm or greater. In Japanese Patent Laid-Open No. 2018-189349, an impurity gas is trapped in the pores, and thereby an amount of the impurity gas that adheres to the wick structure is reduced and flowability for the working fluid is improved. Through the improved flowability for the working fluid, the vapor chamber is intended to improve the heat transfer properties.

However, around the heating element, which is an object to be cooled by the vapor chamber, not only the vapor chamber but also other components having other functions than the heat transfer function are installed. The vapor chamber is disposed in a narrow space as described above, and is often installed in a movable body such as a transport device. Therefore, space-saving and weight reduction are required for the vapor chamber and other components around the vapor chamber as a whole. Although conventional vapor chambers as in Japanese Patent Laid-Open No. 2018-189349 are intended to improve the heat transfer properties, there is room for improvement in contribution to space-saving and weight reduction of a device in which the vapor chamber is to be mounted.

SUMMARY

The present disclosure is related to providing a vapor chamber that allows space-saving and weight reduction of a device in which the vapor chamber is to be mounted.

Outlines of components of the present disclosure are as follows.

[1] A vapor chamber having: a container in which a cavity portion is formed by one plate-shaped body and another plate-shaped body facing the one plate-shaped body; and a working fluid enclosed in the cavity portion, wherein the container includes: a heat transfer portion that transfers heat by a phase change of the working fluid; and an extending portion that extends outwards from the heat transfer portion and has a function other than a heat transfer function.

[2] The vapor chamber according to [1], wherein the one plate-shaped body and the other plate-shaped body are joined to form a joined portion, in which the cavity portion is sealed, around a periphery of the container, and the extending portion is located outside the joined portion.

[3] The vapor chamber according to [1] or [2], wherein the extending portion has an electromagnetic shield function.

[4] The vapor chamber according to [3], wherein the extending portion has a bent portion in a thickness direction of the extending portion, and an end of the extending portion is a free end.

[5] The vapor chamber according to [3], wherein the extending portion has a bent portion in a thickness direction of the extending portion, and an end of the extending portion is in contact with a separate member.

[6] The vapor chamber according to [1] or [2], forming a part of a housing in which a heating element is contained.

[7] The vapor chamber according to [1] or [2], wherein the extending portion is a cover of a blower that supplies cooling air to the heat transfer portion thermally connected to a heating element.

[8] The vapor chamber according to [1] or [2], wherein the extending portion has an attachment portion for a fixing member configured to fix the heat transfer portion in a predetermined position.

[9] The vapor chamber according to [1] or [2], wherein the extending portion has a positioning portion configured to position the heat transfer portion in a predetermined position.

[10] The vapor chamber according to [1] or [2], wherein the extending portion has a fixing region for the vapor chamber.

[11] The vapor chamber according to any one of [2] to [10], wherein the joined portion is a welded portion that is joined by welding with a fiber laser.

[12] The vapor chamber according to any one of [1] to [11], wherein a metal that absorbs hydrogen at 350° C. or lower and does not release hydrogen at 350° C. or lower is provided in the cavity portion.

[13] The vapor chamber according to any one of [1] to [12], wherein a material of the container is copper, a copper-based alloy, iron, an iron alloy, stainless steel, aluminum, an aluminum-based alloy, nickel, a nickel-based alloy, titanium, or a titanium-based alloy.

[14] The vapor chamber according to any one of [1] to [13], wherein a material of the container is stainless steel.

[15] The vapor chamber according to any one of [12] to [14], wherein the metal is a titanium-based alloy, a palladium-based alloy, a vanadium-based alloy, a calcium-based alloy, or a composite alloy of these alloys.

[16] The vapor chamber according to any one of [12] to [15], wherein the metal is a titanium-based alloy.

[17] The vapor chamber according to any one of [12] to [16], wherein the metal is disposed in a region where the working fluid condenses.

[18] The vapor chamber according to any one of [12] to [17], wherein the metal is fixed to the container or a wick structure contained in the cavity portion, and an alloy portion is formed between the metal and the container or the wick structure.

[19] The vapor chamber according to any one of [12] to [18], wherein the metal is fixed to the container or a wick structure contained in the cavity portion by welding, and an alloy portion is formed between the metal and the container or the wick structure.

[20] The vapor chamber according to [18] or [19], wherein the alloy portion contains any of iron, nickel, chromium, titanium, and the metal.

[21] The vapor chamber according to any one of [18] to [20], wherein the alloy portion is 2% by mass to 50% by mass of the metal.

[22] The vapor chamber according to any one of [1] to [21], wherein an amount of hydrogen gas in the cavity portion is 10% by volume or lower of a total amount of gases in the cavity portion at an operation temperature of 50° C.

[23] The vapor chamber according to any one of [18] to [22], wherein a material of the wick structure is titanium or a titanium-based alloy.

[24] The vapor chamber according to any one of [18] to [23], wherein the alloy portion is made by melting and integrally forming the container or the wick structure and the metal.

In an aspect of the vapor chamber described in [1], the heat transfer portion is a section that exerts the heat transfer function, which is a function of conventional vapor chambers, and cools the heating element to be cooled. The extending portion is a section that exerts a separate function different from functions of conventional vapor chambers, and has a function other than that of cooling the heat element. The heat transfer portion and the extending portion are continuous and integrally formed.

According to an aspect of the vapor chamber of the present disclosure, the vapor chamber includes the heat transfer portion that cools the heating element to be cooled and the extending portion that has a function other than the heat transfer function, thus having not only the heat transfer function but also a function other than the heat transfer function. Therefore, it is not necessary to additionally install a separate component having a function other than the heat transfer function, and space-saving and weight reduction of a device in which the vapor chamber is to be mounted can be achieved. Further, since it is not necessary to additionally install a separate component having a function other than the heat transfer function, the number of components of a device in which the vapor chamber is to be mounted can be also reduced.

According to an aspect of the vapor chamber of the present disclosure, the extending portion has the electromagnetic shield function, and thus even when the heating element to be cooled is an electronic component emitting electromagnetic waves and the electromagnetic waves emitted by the heating element needs to be shielded, it is not necessary to additionally install an electromagnetic shield plate as a separate component to shield the electromagnetic waves emitted by the heating element. Therefore, space-saving and weight reduction of a device in which the vapor chamber is to be mounted can be achieved, and the number of components can be also reduced.

According to an aspect of the vapor chamber of the present disclosure, since the end of the extending portion having the electromagnetic shield function is a free end, the thermal connectivity between the heating element to be cooled and the heat transfer portion is improved, and thereby the heat transfer portion can exert excellent cooling properties on the heating element.

According to an aspect of the vapor chamber of the present disclosure, since the end of the extending portion having the electromagnetic shield function is in contact with a separate member, the heat of the heating element to be cooled can be transferred to the separate member through the vapor chamber of the present disclosure, and thereby the extending portion can exert not only the electromagnetic shield function but also a cooling function on the heating element.

According to an aspect of the vapor chamber of the present disclosure, since the vapor chamber forms a part of the housing in which the heating element is contained, it is not necessary to additionally install a vapor chamber on the outer surface of the housing, and thereby space-saving and weight reduction of a device in which the housing is to be mounted can be achieved. Further, since the vapor chamber forms a part of the housing, the thermal connectivity between the heating element contained in the housing and the vapor chamber is improved, and thereby excellent cooling properties can be exerted on the heating element.

According to an aspect of the vapor chamber of the present disclosure, since the extending portion is a cover of a blower that supplies cooling air to the heat transfer portion, it is not necessary to additionally provide a cover of the blower as a separate component. Therefore, space-saving and weight reduction of a device in which the vapor chamber is to be mounted can be achieved, and the number of components can be also reduced.

According to an aspect of the vapor chamber of the present disclosure, since the extending portion has an attachment portion for a fixing member configured to fix the heat transfer portion in a predetermined position, it is not necessary to additionally mount an attachment portion for the fixing member as a separate component in the vapor chamber. Therefore, space-saving and weight reduction of a device in which the vapor chamber is to be mounted can be achieved, and the number of components can be also reduced.

According to an aspect of the vapor chamber of the present disclosure, since the extending portion has a positioning portion configured to position the heat transfer portion in a predetermined position, it is not necessary to additionally mount a positioning portion as a separate component in the vapor chamber. Therefore, space-saving and weight reduction of a device in which the vapor chamber is to be mounted can be achieved, and the number of components can be also reduced.

According to an aspect of the vapor chamber of the present disclosure, since the joined portion is a welded portion that is joined by welding with a fiber laser, joining strength of the welded portion is improved so that excellent sealing properties can be provided to the container, and also heat loads to the container can be prevented in joining the one plate-shaped body and the other plate-shaped body so that excellent mechanical strength can be provided to the container.

DETAILED DESCRIPTION

Figure 1:
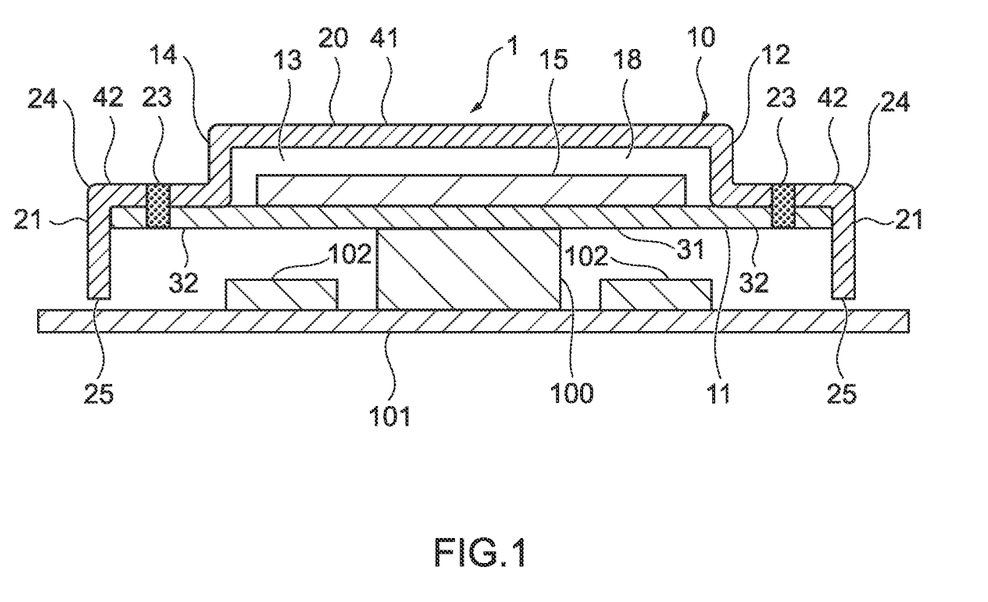
FIG. 1 is an explanatory view illustrating an outline of a vapor chamber according to a first exemplary embodiment of the present disclosure.

Hereinafter, a vapor chamber according to a first exemplary embodiment of the present disclosure will be described with reference to the accompanying drawing. FIG. 1 is an explanatory view illustrating an outline of the vapor chamber according to the first exemplary embodiment of the present disclosure.

As illustrated in FIG. 1, a vapor chamber 1 according to the first exemplary embodiment of the present disclosure has a container 10 that is of a planar type in which a cavity portion 13 is formed by superposing two plate-shaped bodies facing each other, that is, one plate-shaped body 11 and another plate-shaped body 12 facing the one plate-shaped body 11, and a working fluid (not illustrated) enclosed in the cavity portion 13. In the internal space of the cavity portion 13, a wick structure 15 having a capillary structure is contained. A space between an inner surface of the container 10 and the wick structure 15 serves as a vapor flow path 18 through which the gas-phase working fluid flows.

The one plate-shaped body 11 generally has a plate shape including a central portion 31 and a peripheral portion 32 located in the periphery of the central portion 31. Although the other plate-shaped body 12 also has a plate shape, a central portion 41 is plastically deformed in a protruding shape, and a peripheral portion 42 located in the periphery of the central portion 41 is recessed stepwise relative to the central portion 41. In the other plate-shaped body 12, the central portion 41 has a flat plate shape. The central portion 41 of the other plate-shaped body 12 that protrudes outwards and is plastically deformed in a protruding shape is a protruding part 14 of the container 10, and the inside of the protruding part 14 is the cavity portion 13. The protruding part 14 of the container 10 extends with a predetermined thickness in a planar manner.

When the whole circumferences of the peripheral portions 32, 42 are joined along the outer periphery of the protruding part 14 to form a joined portion 23 with the peripheral portion 32 of the one plate-shaped body 11 and the peripheral portion 42 of the other plate-shaped body 12 being superposed on each other, the container 10, which is a closed container, is formed and the cavity portion 13 is sealed. A method of forming the joined portion 23 is not particularly limited, and may include diffusion joining, brazing, laser welding, ultrasonic welding, friction joining, and pressure joining, for example. Among these methods, laser welding is preferable in terms of excellent productivity and sealing properties of the container 10. Laser welding with a fiber laser is particularly preferable in that joining strength between the one plate-shaped body 11 and the other plate-shaped body 12 is improved so that excellent sealing properties can be provided to the container 10, and also heat loads to the container 10 are prevented in joining the one plate-shaped body 11 and the other plate-shaped body 12 so that excellent mechanical strength can be provided to the container 10. The cavity portion 13 is decompressed by deaeration.

The wick structure 15 is a member that is contained in the cavity portion 13 and generates capillary force. The wick structure 15 is porous and thus has a capillary structure. Further, the wick structure 15 is a planar member and extends along the plane of the protruding part 14 of the container 10.

The container 10 of the vapor chamber 1 includes a heat transfer portion 20 that has a heat transfer function and an extending portion 21 that extends outwards from the heat transfer portion 20 and has a function other than the heat transfer function. The heat transfer portion 20 and the extending portion 21 are continuous and integrally formed. The heat transfer portion 20 is located inside the joined portion 23 obtained by joining the one plate-shaped body 11 and the other plate-shaped body 12, and the extending portion 21 is located outside the joined portion 23. Therefore, the joined portion 23 forms a boundary between the heat transfer portion 20 and the extending portion 21.

The heat transfer portion 20 corresponds to the protruding part 14 of the container 10, that is, the cavity portion 13 in which the working fluid is enclosed. Therefore, the heat transfer portion 20 extends with a predetermined thickness in a planar manner. As described later, the heat transfer portion 20 transfers heat, received from a heating element 100 in a heat receiving portion of the heat transfer portion 20, from the heat receiving portion to a heat discharging portion of the heat transfer portion 20 by a phase change of the working fluid, and thereby exerting cooling properties to cool the heating element 100. Further, the heat transfer portion 20 diffuses the heat, received from the heating element 100 in the heat receiving portion, over the heat transfer portion 20 by a phase change of the working fluid, and thereby exerting a function as a soaking plate.

A shape of the heat transfer portion 20 in plan view is not particularly limited, and can be appropriately selected depending on usage conditions of the vapor chamber 1, for example, including a circular shape, a long fence shape, and a polygonal shape. "Plan view" means a state which is visually recognized from the vertical direction relative to the plane of the heat transfer portion 20.

The extending portion 21 having a function other than the heat transfer function may be formed by extending the peripheral portion 32 of the one plate-shaped body 11 outwards from the joined portion 23, by extending the peripheral portion 42 of the other plate-shaped body 12 outwards from the joined portion 23, or by extending both the peripheral portion 32 of the one plate-shaped body 11 and the peripheral portion 42 of the other plate-shaped body 12 outwards from the joined portion 23. In the vapor chamber 1, the extending portion 21 having a function other than the heat transfer function is formed by extending the peripheral portion 42 of the other plate-shaped body 12 outwards from the joined portion 23.

The extending portion 21 has a function different from that of the heat transfer portion 20. In other words, the extending portion 21 has a function other than the heat transfer function. Therefore, the vapor chamber 1 has, in addition to the heat transfer function by a phase change of the working fluid, a function other than the heat transfer function.

As illustrated in FIG. 1, in the vapor chamber 1, the extending portion 21 has a function as an electromagnetic shield plate that shields electromagnetic waves emitted by the heating element 100 to be cooled. For example, when the heating element 100 is a central processing unit (CPU) mounted on a circuit board 101, it is necessary to additionally install an electromagnetic shield plate around the heating element 100 to prevent the electromagnetic waves emitted by the heating element 100 from adversely affecting the operation of other components (not illustrated) located around the circuit board 101. However, in the vapor chamber 1, since the extending portion 21 has a function as an electromagnetic shield plate, an electromagnetic shield plate, which is a separate part, does not need to be installed.

The vapor chamber 1 has a bent portion 24 in which the extending portion 21 is bent in the thickness direction of the extending portion 21. A part of the extending portion 21 from the bent portion 24 to an end 25 extends in a direction substantially perpendicular to the plane direction of the heat transfer portion 20. The part of the extending portion 21 from the bent portion 24 to the end 25 has a function as an electromagnetic shield plate.

The end 25 of the extending portion 21 is a free end that is not in contact with the circuit board 101. A slight gap exists between the end 25 of the extending portion 21 and a surface of the circuit board 101. Therefore, since the heat transfer portion 20 can be in contact with the heating element 100 to be cooled without interference by the extending portion 21, the thermal connectivity between the heating element 100 and the heat transfer portion 20 is improved, and thereby the heat transfer portion 20 can exert excellent cooling properties on the heating element 100 and also have an improved function as a soaking plate.

The end 25 of the extending portion 21 may take an aspect in which the end 25 is in contact with the circuit board 101 instead of being a free end that is not in contact with the circuit board 101. Since the end 25 of the extending portion 21 is in contact with the circuit board 101, the heat of the heating element 100 to be cooled is transferred to the circuit board 101 through the vapor chamber 1, and thereby the extending portion 21 can exert not only an electromagnetic shield function but also a cooling function on the heating element 100.

The extending portion 21 may extend outwards from the whole circumference of the heat transfer portion 20, or may extend from a part of the circumference of the heat transfer portion 20. For example, when the heat transfer portion 20 has a quadrangular shape in plan view, the extending portion 21 may extend from four edges of the heat transfer portion 20, or may extend only from some of the edges (for example, two opposite edges). For convenience of explanation, in the vapor chamber 1, the heat transfer portion 20 has a quadrangular shape in plan view, and the extending portions 21 extend from two opposite edges.

A material of the container 10 may include stainless steel, copper, aluminum, titanium, iron, nickel, copper-based alloys, aluminum-based alloys, titanium-based alloys, iron-based alloys, and nickel-based alloys, for example. These materials may be used independently or in combination of two or more materials. Among these materials, stainless steel is preferable in view of balance among lightness, mechanical strength, and workability such as bending.

The working fluid enclosed in the cavity portion 13 can be appropriately selected depending on compatibility with the material of the container 10, and may include water, alternative fluorocarbons, fluorocarbons, cyclopentane, and ethylene glycol, for example. These fluids may be used independently or in a mixture of two or more fluids.

The wick structure 15 is not particularly limited as long as having a structure that generates capillary force, and may include, a sintered body of metal powders, a sintered body of metal short fibers, a metal mesh, or a braided body of metal wires, a filament body of metal wires, and a plurality of grooves formed in the inner surface of the cavity portion 13, for example. In the vapor chamber 1, a metal mesh is used as the wick structure 15. A material of the wick structure can be appropriately selected, and may include titanium, titanium-based alloys, copper, copper-based alloys, iron, iron-based alloys, stainless steel, aluminum, aluminum-based alloys, nickel, and nickel-based alloys, for example.

A thickness of the heat transfer portion 20 of the vapor chamber 1 may be 0.2 mm to 1.0 mm, for example. Average thicknesses of the one plate-shaped body 11 and the other plate-shaped body 12 may be the same or different from each other, and may each be 0.05 mm to 0.1 mm, for example.

Next, operation of the heat transfer portion 20 will be described. In the outer surface of the heat transfer portion 20 of the container 10, a region that is thermally connected to the heating element 100 (a region where the heating element 100 is in contact with the outer surface of the heat transfer portion 20) functions as the heat receiving portion. When the heat transfer portion 20 receives heat from the heating element 100, the liquid-phase working fluid enclosed in the cavity portion 13 undergoes a phase change from liquid to gas in the heat receiving portion, and the gas-phase working fluid that has undergone the phase change flows through the vapor flow path 18 to move from the heat receiving portion to the heat discharging portion (a region located at a predetermined interval away from the contact portion between the heating element 100 and the heat transfer portion 20) of the heat transfer portion 20. The gas-phase working fluid that has moved from the heat receiving portion to the heat discharging portion discharges latent heat in the heat discharging portion, and undergoes a phase change from gas to liquid. The latent heat discharged in the heat discharging portion is further discharged to the external environment of the vapor chamber 1. The working fluid that has undergone the phase change from gas to liquid in the heat discharging portion is circulated from the heat discharging portion to the heat receiving portion by capillary force of the wick structure 15 contained in the heat transfer portion 20.

In this way, even when the heating element 100 to be cooled by the vapor chamber 1 is an electronic component that emits electromagnetic waves, it is not necessary to additionally install an electromagnetic shield plate as a separate component to shield the electromagnetic waves emitted by the heating element 100. Therefore, space-saving and weight reduction of a device in which the vapor chamber 1 is to be mounted can be achieved, and the number of components can be also reduced. In addition, since an electromagnetic shield plate can be installed around the heating element 100 by thermally connecting the heat transfer portion 20 of the vapor chamber 1 to the heating element 100, the manufacture of a device in which the vapor chamber 1 is to be mounted is simplified.

As illustrated in FIG. 1, other electronic components 102 than the heating element 100 to be cooled are also mounted on the circuit board 101. When the other electronic components 102 are located between the heat transfer portion 20 and the circuit board 101, the extending portion 21 can also shield electromagnetic waves emitted by the other electronic components 102. Therefore, in the vapor chamber 1, the shielding properties against the electromagnetic waves emitted by the electronic components mounted on the circuit board 101 can be further improved.

Figure 2:
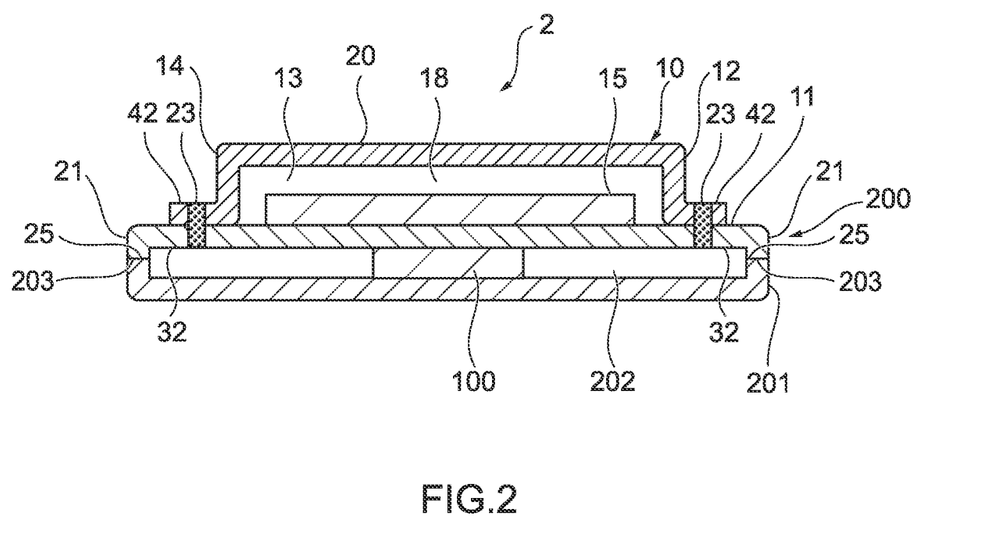
FIG. 2 is an explanatory view illustrating an outline of a vapor chamber according to a second exemplary embodiment of the present disclosure.

Next, a vapor chamber according to a second exemplary embodiment of the present disclosure will be described with reference to the accompanying drawing. Main components of the vapor chamber according to the second exemplary embodiment are common to the vapor chamber according to the first exemplary embodiment, and the same components will be described using the same respective signs. FIG. 2 is an explanatory view illustrating an outline of the vapor chamber according to the second exemplary embodiment of the present disclosure.

As illustrated in FIG. 2, a vapor chamber 2 according to the second exemplary embodiment of the present disclosure is a part of a housing 200 in which the heating element 100 is contained. An internal space 202 closed to outside is formed by a housing portion 201 forming a part of the housing 200 and the vapor chamber 2, and the heating element 100 is contained in the internal space 202. The outer surface of the heat transfer portion 20 and the extending portion 21 of the vapor chamber 2 are a part of an inner surface of the housing 200. Therefore, the extending portion 21 has a function as a part of the housing 200. The heat transfer portion 20 also has a function as a part of the housing 200. The heating element 100 contained in the housing 200 is thermally connected to the heat transfer portion 20 of the vapor chamber 2, which is a part of the inner surface of the housing 200, and thereby the heating element 100 is cooled by the heat transfer function of the heat transfer portion 20.

In the vapor chamber 2, the extending portion 21 having a function other than the heat transfer function is formed by extending the peripheral portion 32 of one plate-shaped body 11 outwards from the joined portion 23. The end 25 of the extending portion 21 is in contact with an end portion 203 of the housing portion 201 forming a part of the housing 200.

For the vapor chamber 2, it is not necessary to additionally install a vapor chamber on the outer surface of the housing 200, and thereby space-saving and weight reduction of the vapor chamber 2, and thus a device in which the housing 200 is to be mounted can be achieved. Further, since the vapor chamber 2 forms a part of the housing 200, the thermal connectivity between the heating element 100 contained in the housing 200 and the vapor chamber 2 is improved, and thereby excellent cooling properties can be exerted on the heating element 100.

The housing 200 in which the heating element 100 is contained includes a shield case in which a battery (a storage battery) of an electric vehicle is contained, and a housing of a personal computer or a portable information terminal in which an electronic component such as a central processing unit is contained, for example. In FIG. 2, the heating element 100 is an electronic component such as a central processing unit, and the housing 200 is a housing of a personal computer in which the electronic component such as a central processing unit is contained. In addition, a housing of a personal computer in which an electronic component such as a central processing unit is contained includes a housing provided with a liquid crystal screen, for example.

As illustrated in FIG. 2, the vapor chamber 2 also serves as a lid of the housing 200. The heat transfer portion 20 is located in the center of the lid of the housing 200 and the extending portion 21 is located in the periphery of the lid of the housing 200. Further, the protruding part 14 of the container 10 is located in the outer surface of the lid of the housing 200. The electronic component such as a central processing unit, which is the heating element 100, is in contact with the center of the lid of the housing 200, and thereby thermally connected to the heat transfer portion 20 of the vapor chamber 2.

Figure 3:
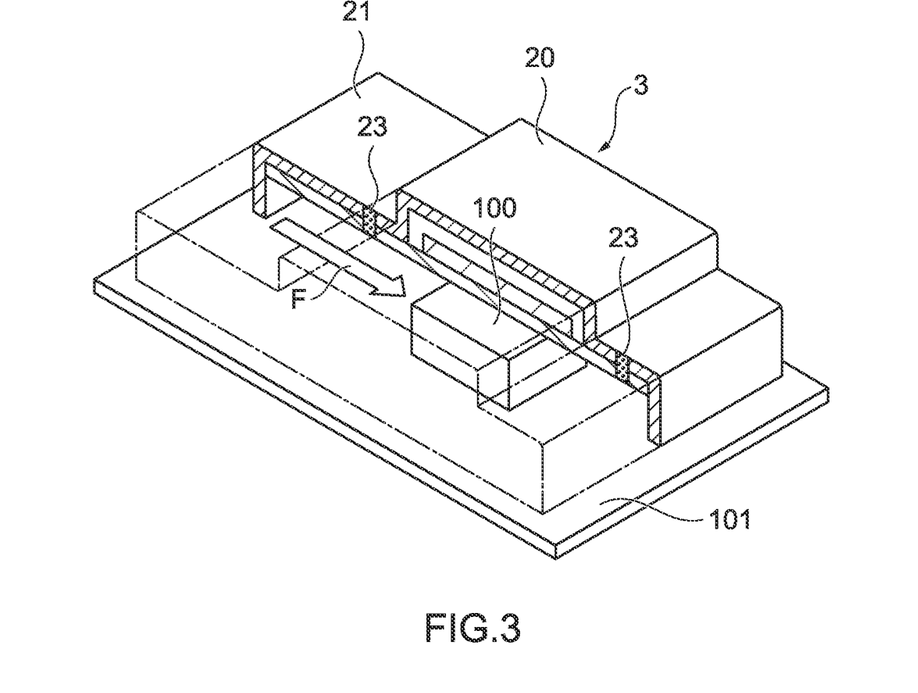
FIG. 3 is an explanatory view illustrating an outline of a vapor chamber according to a third exemplary embodiment of the present disclosure.

Next, a vapor chamber according to a third exemplary embodiment of the present disclosure will be described with reference to the accompanying drawing. Main components of the vapor chamber according to the third exemplary embodiment are common to the vapor chambers according to the first and the second exemplary embodiments, and the same components will be described using the same respective signs. FIG. 3 is an explanatory view illustrating an outline of the vapor chamber according to the third exemplary embodiment of the present disclosure.

As illustrated in FIG. 3, in a vapor chamber 3 according to the third exemplary embodiment of the present disclosure, the extending portion 21 serves as a cover of a blower (not illustrated) that supplies cooling air F to the heat transfer portion 20 thermally connected to the heating element 100. In FIG. 3, the extending portion 21 covers the upper surface and opposite side surfaces of the blower. A region of the blower that faces the heating element 100 is open, and a space in which the blower is installed and a space in which the heating element 100 is mounted communicate with each other. In the vapor chamber 3, the heat transfer portion 20 cools the heating element 100 by its heat transfer function, and the cooling air F from the blower flows along the extending portion 21 functioning as the cover of the blower toward the heat transfer portion 20. The heating element 100 includes, for example, an electronic component mounted on the circuit board 101, and the blower includes, for example, a supply fan.

In the vapor chamber 3, since the extending portion 21 is the cover of the blower supplying the cooling air F to the heat transfer portion 20, it is not necessary to additionally provide a cover of the blower as a separate component. Therefore, space-saving and weight reduction of a device in which the vapor chamber 3 is to be mounted can be achieved, and the number of components can be also reduced.

Figure 4:
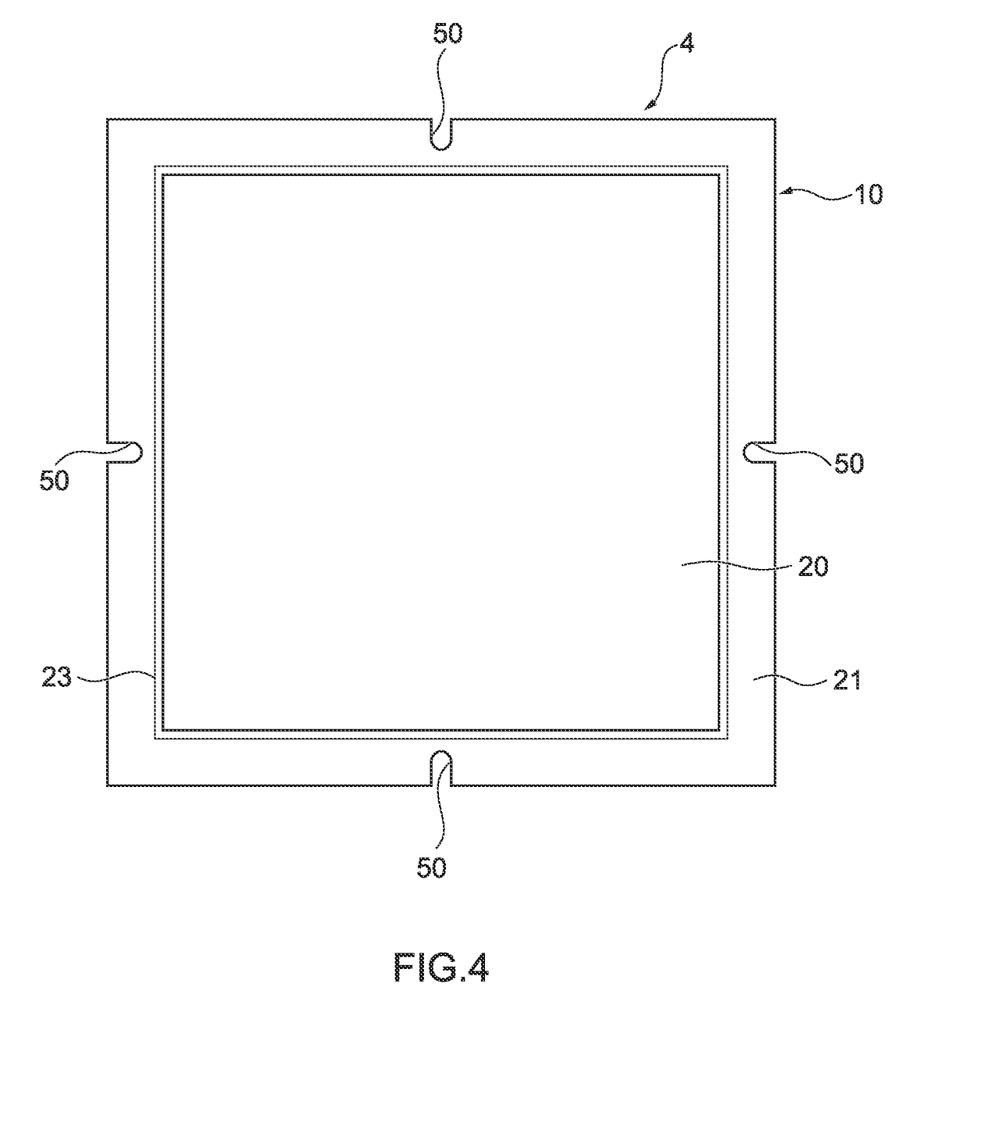
FIG. 4 is an explanatory view illustrating an outline of a vapor chamber according to a fourth exemplary embodiment of the present disclosure.

Next, a vapor chamber according to a fourth exemplary embodiment of the present disclosure will be described with reference to the accompanying drawing. Main components of the vapor chamber according to the fourth exemplary embodiment are common to the vapor chambers according to the first to the third exemplary embodiments, and the same components will be described using the same respective signs. FIG. 4 is an explanatory view illustrating an outline of the vapor chamber according to the fourth exemplary embodiment of the present disclosure.

As illustrated in FIG. 4, in a vapor chamber 4 according to the fourth exemplary embodiment of the present disclosure, the extending portion 21 has attachment portions 50 for fixing members configured to fix the heat transfer portion 20 in a predetermined position. Therefore, the extending portion 21 of the vapor chamber 4 has a fixing function on the heat transfer portion 20. In the vapor chamber 4, a plurality of notches formed in the extending portion 21 serve as the attachment portions 50 for the fixing members. In FIG. 4, the attachment portions 50 for the fixing members are provided in four areas. For convenience of explanation, in FIG. 4, each of the attachment portions 50 for the fixing members is provided in each edge of the vapor chamber 4, which has a quadrangular shape in plan view. In the vapor chamber 4, the extending portion 21 is not provided with a bent portion in the thickness direction, and being flat.

The fixing members (not illustrated) such as screws are inserted in the attachment portions 50 for the fixing members so that the vapor chamber 4 can be fixed in a predetermined position by screw clamping, for example. Since the extending portion 21 has the attachment portions 50 for the fixing members, it is not necessary to additionally mount an attachment member for the fixing member in the vapor chamber as a separate component. Therefore, space-saving and weight reduction of a device in which the vapor chamber 4 is mounted can be achieved, and the number of components can be also reduced.

The attachment portions 50 for the fixing members of the vapor chamber 4 function as positioning portions configured to position the heat transfer portion 20 in a predetermined position by inserting a positioning member such as a pin in each attachment portion 50. Therefore, the extending portion 21 of the vapor chamber 4 can have a positioning function on the heat transfer portion 20.

Since the extending portion 21 has the positioning portion configured to fix the heat transfer portion 20 in a predetermined position, it is not necessary to additionally mount a positioning member as a separate component in the vapor chamber. Therefore, space-saving and weight reduction of a device in which the vapor chamber 4 is to be mounted can be achieved, and the number of components can be also reduced.

Figure 5:
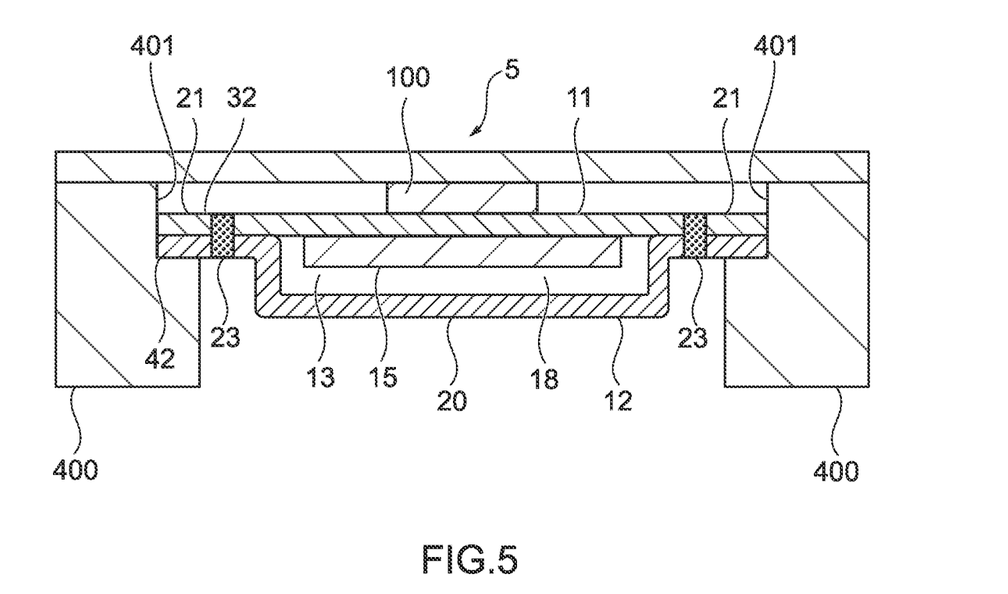
FIG. 5 is an explanatory view illustrating an outline of a vapor chamber according to a fifth exemplary embodiment of the present disclosure.

Next, a vapor chamber according to a fifth exemplary embodiment of the present disclosure will be described with reference to the accompanying drawing. Main components of the vapor chamber according to the fifth exemplary embodiment are common to the vapor chambers according to the first to the fourth exemplary embodiments, and the same components will be described using the same respective signs. FIG. 5 is an explanatory view illustrating an outline of the vapor chamber according to the fifth exemplary embodiment of the present disclosure.

As illustrated in FIG. 5, in a vapor chamber 5 according to the fifth exemplary embodiment of the present disclosure, the extending portion 21 functions as a fixing region for the vapor chamber 5. In FIG. 5, the extending portion 21, which has a flat plane shape, is fixed to a fixing portion 400, having a step 401 provided in a desired fixing position, by placing the extending portion 21 along the step 401. Therefore, the extending portion 21 of the vapor chamber 5 has a fixing function to fix the heat transfer portion 20 in a predetermined position. In the vapor chamber 5, both the peripheral portion 32 of the one plate-shaped body 11 and the peripheral portion 42 of the other plate-shaped body 12 are formed by extending outwards from the joined portion 23 in surface contact with each other. In the vapor chamber 5, the extending portion 21 is not provided with a bent portion in the thickness direction, and being flat. The vapor chamber 5 is thermally connected to the heating element 100 located on the upper side in the gravity direction.

Since the extending portion 21 has a fixing function to fix the vapor chamber 5 in a predetermined position, it is not necessary to additionally mount a fixing member in the vapor chamber as a separate component. Therefore, space-saving and weight reduction of a device in which the vapor chamber 5 is to be mounted can be achieved, and the number of components can be also reduced.

As in the exemplary embodiments described above, the vapor chamber of the present disclosure includes the heat transfer portion that cools the heating element to be cooled and the extending portion that has a function other than the heat transfer function, and thus having not only the heat transfer function but also a function other than the heat transfer function. Therefore, it is not necessary to additionally install a separate component having a function other than the heat transfer function, and space-saving and weight reduction of a device in which the vapor chamber is to be mounted can be achieved. Further, since it is not necessary to additionally install a separate component having a function other than the heat transfer function, the number of components of a device in which the vapor chamber is to be mounted can be also reduced.

In the vapor chamber of the present disclosure, a metal (not illustrated) that absorbs hydrogen at 350° C. or lower and does not release hydrogen at 350° C. or lower may be disposed in the cavity portion of the container. By providing the metal that absorbs hydrogen 350° C. or lower and does not release hydrogen at 350° C. or lower in the cavity portion, the metal absorbs a non-condensable gas such as hydrogen gas, and consequently the vapor chamber exerting excellent heat transfer properties over the long term can be obtained.

With respect to the metal that absorbs hydrogen at 350° C. or lower and does not release hydrogen at 350° C. or lower (hereinafter, may be referred to as "hydrogen absorbing metal"), regions where the metal is disposed and the number of the regions where the metal is disposed are not particularly limited. The non-condensable gas such as hydrogen gas does not condense and is still present in a gas phase even in a condensation portion of the container, having a tendency not to circulate from the heat discharging portion of the heat transfer portion (that is, a condensation portion for the working fluid) to the heat receiving portion of the heat transfer portion (that is, an evaporation portion for the working fluid) and to stay in the condensation portion. Therefore, in view of efficiently absorbing the non-condensable gas such as hydrogen gas, the hydrogen absorbing metal is preferably disposed in at least a part of the condensation portion for the working fluid.

The hydrogen absorbing metal is welded to the inner surface of the container, and thereby being fixed to the container. Further, since the hydrogen absorbing metal is welded to the inner surface of the container, an alloy portion that contains a component of the hydrogen absorbing metal and a component of the container is formed in the inner surfaces of the container and the hydrogen absorbing metal.

The alloy portion is a region where the container and the hydrogen absorbing metal are melted and integrally formed with each other. On the other hand, a region of the hydrogen absorbing metal that does not contribute to the formation of the alloy portion remains the original component of the hydrogen absorbing metal.

As described above, both the alloy portion and the region of the hydrogen absorbing metal not contributing to the formation of the alloy portion are disposed on the inner surface of the container in a state of being exposed to the cavity portion of the container, and take an aspect in which they are in direct contact with the working fluid.

For the hydrogen absorbing metal disposed inside the container, although a ratio of a part of the hydrogen absorbing metal that forms the alloy portion with the container is not particularly limited, the lower limit value of the ratio is preferably 2% by mass in view of smoothly introducing hydrogen into a part of the hydrogen absorbing metal that does not form the alloy portion, more preferably 5% by mass in view of rapidly and surely capturing the generated hydrogen gas, and particularly preferably 8% by mass. On the other hand, for the hydrogen absorbing metal disposed inside the container, the upper limit value of the ratio of a part of the hydrogen absorbing metal that forms the alloy portion with the container is preferably 50% by mass in view of surely preventing deterioration of absorption capacity for hydrogen at 350° C. or lower, more preferably 40% by mass in view of achieving excellent absorption capacity for hydrogen at 350° C. or lower, and particularly preferably 30% by mass.

A material of the hydrogen absorbing metal is not particularly limited, and may include a titanium-alloy-based material, a palladium-alloy-based material, a vanadium-alloy-based material, a calcium-alloy-based material, and a composite material of these alloy-based materials, for example. The alloy portion contains any of iron, nickel, chromium, titanium, and the above-mentioned metal, for example.

At least a part of the hydrogen absorbing metal forms the alloy portion with the container, and thereby capacity of the hydrogen absorbing metal for absorbing hydrogen at 350° C. or lower and not releasing hydrogen at 350° C. or lower, that is, absorption capacity for hydrogen at 350° C. or lower is enhanced. Accordingly, deterioration of a vacuum state, due to the non-condensable gas such as hydrogen gas staying in the cavity portion of the container, is prevented. Therefore, the vapor chamber having excellent heat transfer properties can be obtained. Further, even when the vapor chamber reaches a temperature close to 300° C. in processing such as soldering and welding in a manufacturing process of the vapor chamber and the non-condensable gas such as hydrogen gas is generated in the above-mentioned processing process, the non-condensable gas such as hydrogen gas can be prevented from releasing to the cavity portion since the metal that absorbs hydrogen at 350° C. or lower and does not release hydrogen at 350° C. or lower is provided in the vapor chamber. Consequently, the vapor chamber having excellent heat transfer properties can be obtained even through the above-mentioned processing process. For the heat transfer portion with the hydrogen absorbing metal provided in the cavity portion of the container, an amount of hydrogen gas staying in the cavity portion of the container is 10% by volume or lower of the total amount of gases in the cavity portion at an operation temperature of 50° C.

In the above-mentioned aspect, the hydrogen absorbing metal is welded to the inner surface of the container, and thereby being fixed to the container. Instead of this manner, the hydrogen absorbing metal may be welded to a surface of the wick structure, and thus may be fixed to the wick structure. Since the hydrogen absorbing metal is welded to the surface of the wick structure, the alloy portion containing a component of the hydrogen absorbing metal and a component of the wick structure is formed on the surfaces of the wick structure and the hydrogen absorbing metal.

Also in the vapor chamber of the above-mentioned aspect, the hydrogen absorbing metal can have enhanced absorption capacity for the non-condensable gas such as hydrogen gas at 350° C. or lower, and excellent heat transfer properties can be, in turn, obtained.

In the vapor chamber of the present disclosure, space-saving and weight reduction of a device in which the vapor chamber is to be mounted can be achieved. Therefore, the vapor chamber is applicable not only in the fields of the above-mentioned exemplary embodiments, but also in a wide range of fields.

What is claimed is:

1. A vapor chamber comprising: a container in which a cavity portion is formed by one plate-shaped body and another plate-shaped body facing the one plate-shaped body; and a working fluid enclosed in the cavity portion,
   wherein the container includes: a heat transfer portion that transfers heat by a phase change of the working fluid; and an extending portion that extends outwards from the heat transfer portion and has an electromagnetic shield function,
   the extending portion has a bent portion in a thickness direction of the extending portion, and an end of the extending portion is a free end, and
   wherein when installed, both the one plate-shaped body and the other plate-shaped body are configured to not be in contact with a circuit board,
   a gap exists between the one plate-shaped body and the circuit board, and
   a second gap exists between the other plate-shaped body and the circuit board.

2. The vapor chamber according to claim 1, wherein the one plate-shaped body and the other plate-shaped body are joined to form a joined portion, in which the cavity portion is sealed, around a periphery of the container, and the extending portion is located outside the joined portion.

3. The vapor chamber according to claim 2, wherein the joined portion is a welded portion that is joined by welding with a fiber laser.

4. The vapor chamber according to claim 1, wherein a metal that absorbs hydrogen at 350° C. or lower and does not release hydrogen at 350° C. or lower is provided in the cavity portion.

5. The vapor chamber according to claim 1, wherein a material of the container is copper, a copper-based alloy, iron, an iron alloy, stainless steel, aluminum, an aluminum-based alloy, nickel, a nickel-based alloy, titanium, or a titanium-based alloy.

6. The vapor chamber according to claim 1, wherein a material of the container is stainless steel.

7. The vapor chamber according to claim 4, wherein the metal is a titanium-based alloy, a palladium-based alloy, a vanadium-based alloy, a calcium-based alloy, or a composite alloy of these alloys.

8. The vapor chamber according to claim 4, wherein the metal is a titanium-based alloy.

9. The vapor chamber according to claim 4, wherein the metal is disposed in a region where the working fluid condenses.

10. The vapor chamber according to claim 4, wherein the metal is fixed to the container or a wick structure contained in the cavity portion, and an alloy portion is formed between the metal and the container or the wick structure.

11. The vapor chamber according to claim 4, wherein the metal is fixed to the container or a wick structure contained in the cavity portion by welding, and an alloy portion is formed between the metal and the container or the wick structure.

12. The vapor chamber according to claim 10, wherein the alloy portion contains any of iron, nickel, chromium, titanium, and the metal.

13. The vapor chamber according to claim 10, wherein the alloy portion is 2% by mass to 50% by mass of the metal.

14. The vapor chamber according to claim 1, wherein an amount of hydrogen gas in the cavity portion is 10% by volume or lower of a total amount of gases in the cavity portion at an operation temperature of 50° C.

15. The vapor chamber according to claim 10, wherein a material of the wick structure is titanium-based or a titanium alloy.

16. The vapor chamber according to claim 10, wherein the alloy portion is made by melting and integrally forming the container or the wick structure and the metal.

17. The vapor chamber according to claim 1, wherein the gap exists between the end of the extending portion and the circuit board.

* * * * *